United States Patent
Chen et al.

(10) Patent No.: US 8,213,215 B2
(45) Date of Patent: *Jul. 3, 2012

(54) RESISTIVE SENSE MEMORY CALIBRATION FOR SELF-REFERENCE READ METHOD

(75) Inventors: Yiran Chen, Eden Prairie, MN (US); Hai Li, Eden Prairie, MN (US); Wenzhong Zhu, Apple Valley, MN (US); Xiaobin Wang, Chanhasssen, MN (US); Henry Huang, Apple Valley, MN (US); Hongyue Liu, Maple Grove, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/015,085

(22) Filed: Jan. 27, 2011

(65) Prior Publication Data

US 2011/0122679 A1 May 26, 2011

Related U.S. Application Data

(63) Continuation of application No. 12/390,728, filed on Feb. 23, 2009, now Pat. No. 7,898,838.

(60) Provisional application No. 61/109,962, filed on Oct. 31, 2008.

(51) Int. Cl.
*G11C 11/00* (2006.01)
*G11C 5/14* (2006.01)
*G11C 7/06* (2006.01)

(52) U.S. Cl. ... 365/148; 365/158; 365/163; 365/189.07; 365/189.09

(58) Field of Classification Search ............... 365/148, 365/158, 163, 189.07, 189.09
See application file for complete search history.

(56) References Cited

U.S. PATENT DOCUMENTS

| | | | |
|---|---|---|---|
| 6,317,356 | B1 | 11/2001 | Hoffmann |
| 6,804,141 | B1 | 10/2004 | Rickes et al. |
| 6,870,760 | B2 | 3/2005 | Tsang |
| 7,102,946 | B2 | 9/2006 | Pelella |
| 7,123,505 | B2 | 10/2006 | Jeong |
| 7,170,308 | B1 | 1/2007 | Rahim et al. |
| 7,170,782 | B2 | 1/2007 | Conley et al. |
| 7,187,577 | B1 | 3/2007 | Wang et al. |

(Continued)

OTHER PUBLICATIONS

U.S. Appl. No. 12/147,727, filed Jun. 27, 2008, Chen.

(Continued)

*Primary Examiner* — Ly D Pham
(74) *Attorney, Agent, or Firm* — Mueting Raasch & Gebhardt PA

(57) ABSTRACT

Resistive memory calibration for self-reference read methods are described. One method of self-reference reading a resistive memory unit includes setting a plurality of resistive memory units to a first resistive data state. The resistive memory units forms a memory array. Reading a sensed resistive data state for each resistive memory unit by applying a first read current and a second read current through each resistive memory unit and then comparing voltages formed by the first read current and the second read current to determine the sensed resistive data state for each resistive memory unit. Then the method includes adjusting the first or the second read current, read voltages, or storage device capacitance for each resistive memory unit where the sensed resistive data state was not the same as the first resistive data state until the sensed resistive data state is the same as the first resistive data state.

20 Claims, 8 Drawing Sheets

U.S. PATENT DOCUMENTS

| | | |
|---|---|---|
| 7,224,601 B2 | 5/2007 | Panchula |
| 7,272,034 B1 | 9/2007 | Chen et al. |
| 7,272,035 B1 | 9/2007 | Chen et al. |
| 7,289,356 B2 | 10/2007 | Diao et al. |
| 7,345,912 B2 | 3/2008 | Luo et al. |
| 7,379,327 B2 | 5/2008 | Chen et al. |
| 7,502,249 B1 | 3/2009 | Ding |
| 7,515,457 B2 | 4/2009 | Chen et al. |
| 2002/0126524 A1 | 9/2002 | Sugibayashi et al. |
| 2003/0038617 A1* | 2/2003 | Yaklin .......................... 323/304 |
| 2006/0013039 A1 | 1/2006 | Braun et al. |
| 2006/0098498 A1 | 5/2006 | Jeong et al. |
| 2006/0233018 A1 | 10/2006 | Tanizaki |
| 2008/0310213 A1 | 12/2008 | Chen et al. |
| 2008/0310219 A1 | 12/2008 | Chen et al. |
| 2009/0040855 A1 | 2/2009 | Luo et al. |
| 2009/0185410 A1 | 7/2009 | Huai et al. |

OTHER PUBLICATIONS

Hosomi et al., A Novel Nonvolatile Memory with Spin Torque Transfer Magnetization Switching: Spin-RAM, 2005 IEEE.

* cited by examiner

RESISTIVE SENSE MEMORY CALIBRATION FOR SELF-REFERENCE READ METHOD

CROSS-REFERENCE TO RELATED APPLICATIONS

This application is a continuation application of U.S. patent application Ser. No. 12/390,728 which claims the benefit of U.S. Provisional Application No. 61/109,962 filed Oct. 31, 2008, the contents of which is hereby incorporated by reference in its entirety.

BACKGROUND

Fast growth of the pervasive computing and handheld/communication industry has generated exploding demand for high capacity nonvolatile solid-state data storage devices. Current technology like flash memory has several drawbacks such as slow access speed, limited endurance, and the integration difficulty. Flash memory (NAND or NOR) also faces significant scaling problems.

Resistive sense memories are promising candidates for future nonvolatile and universal memory by storing data bits as either a high or low resistance state. One such memory, MRAM, features non-volatility, fast writing/reading speed, almost unlimited programming endurance and zero standby power. The basic component of MRAM is a magnetic tunneling junction (MTJ). MRAM switches the MTJ resistance by using a current induced magnetic field to switch the magnetization of MTJ. As the MTJ size shrinks, the switching magnetic field amplitude increases and the switching variation becomes more severe. Resistive RAM (RRAM) is another resistive sense memory that has a variable resistance layer that can switch between a high resistance state and a low resistance state (for example by the presence or absence of a conductive filament) by applicant of a current or voltage.

However, many yield-limiting factors must be overcome before resistive sense memory enters the production stage. One challenge is the large resistance variation among the high resistance states and the low resistance states found in a resistive sense memory array. In spin-torque transfer RAM (STRAM), this is exponentially dependent on the thickness of an oxide barrier. The resistance variation in an MRAM, RRAM or STRAM array can be so large that the distributions of the resistance of a reference cell and that of a sensed cell may overlap. In such a situation, a sensing error may occur.

BRIEF SUMMARY

The present disclosure relates to resistive memory calibration for self-reference read methods. The described calibration methods compensate for the process variation that exists from the processing of the resistive memory arrays and particularly when a non-destructive self-reference read is applied to each resistive memory cell.

One method of self-reference reading a resistive memory unit includes setting a plurality of resistive memory units to a first resistive data state. The resistive memory units form a memory array. The method then includes reading a sensed resistive data state for each resistive memory unit by applying a first read current and a second read current through each resistive memory unit and then comparing voltages formed by the first read current and the second read current to determine the sensed resistive data state for each resistive memory unit. Then the method includes adjusting the first read current or the second read current for each resistive memory unit where the sensed resistive data state was not the same as the first resistive data state until the sensed resistive data state is the same as the first resistive data state.

Another illustrative method of calibrating a self-reference read of a resistive memory array includes setting a plurality of resistive sense memory units to a first resistive data state. The resistive sense memory units form a memory array. The method then includes reading a sensed resistive data state for each resistive sense memory unit by applying a first read current and a second read current through each resistive sense memory unit and then storing a first read voltage formed by the first read current in a first voltage storage device and storing a second read voltage formed by the second read current in a second voltage storage device and then comparing the first read voltage with the second read voltage to determine the sensed resistive data state for each resistive sense memory unit. The method then includes adjusting capacitance of the first or second voltage storage device for each resistive sense memory unit where the sensed resistive data state was not the same as the first resistive data state until the sensed resistive data state is the same as the first resistive data state.

A further illustrative method of calibrating a self-reference read of a resistive memory unit array includes setting a plurality of resistive memory units to a first resistive data state. The resistive memory units form a memory array. Then the method includes reading a sensed resistive data state for each resistive memory unit by applying a first read voltage and a second read voltage across each resistive memory unit and then comparing the first read voltage with the second read voltage to determine the sensed resistive data state for each resistive memory unit. Then the method includes adjusting the first or second read voltage for each resistive memory unit where the sensed resistive data state was not the same as the first resistive data state until the sensed resistive data state is the same as the first resistive data state.

An illustrative resistive memory apparatus includes an array of resistive memory units and a self-reference read circuit having an electrical adjustment circuit for adjusting an electrical property of the self-reference read circuit so that sensed resistive data can be adjusted until the sensed resistive data state is the same as a predetermined first resistive data state for each resistive memory unit.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to resistive sense memory apparatus and self-reference non-destructive read schemes. In particular, present disclosure relates to calibration methods that compensate for the process variation that exists from the processing of the resistive sense memory arrays and particularly when a non-destructive self-reference read is applied to each resistive memory cell. The calibration methods can statically or dynamically adjust the ratio between two sensing currents/voltages so as to maximize the sense margin of self-reference non-destructive read schemes for each resistive data cell in a memory array. These ratios can be adjusted following manufacture of the memory array and before product shipping. While the present disclosure is not so limited, an appreciation of various aspects of the disclosure will be gained through a discussion of the examples provided below.

Figure 1:
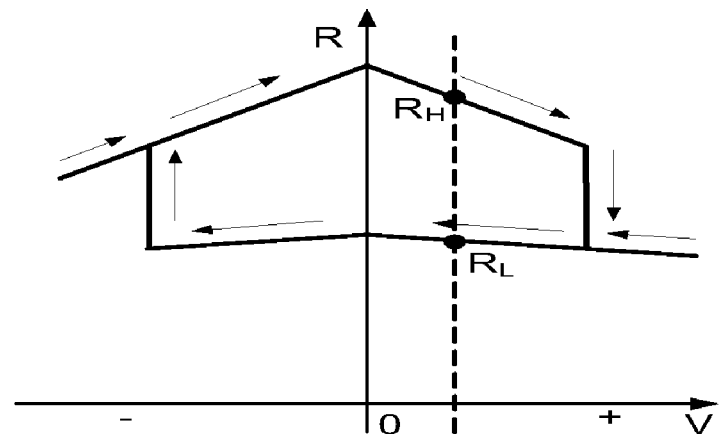
FIG. 1 is a graph of a static R-V (resistance-voltage) curve of a resistive sense memory unit.

FIG. 1 is a graph of a static R-V sweep curve of a resistive sense memory unit. In some embodiments, when applying a positive voltage on a first electrode, the resistive sense memory unit enters the negative applied voltage region in FIG. 1 and switches from a low resistance state to a high resistance state. In some embodiments, a low resistance state exists when two adjacent magnetic layers have parallel magnetization orientations or when variable resistive memory unit has a conductive filament, electrically connecting the first and second electrode, present. When applying a positive voltage on a second electrode, the resistive sense memory unit enters the positive applied voltage region in FIG. 1. The resistance of the resistive sense memory unit switches from the high resistance state to the low resistance state. In some embodiments, a high resistance state exists when two adjacent magnetic layers have anti-parallel magnetization orientations or when variable resistive memory unit does not have a conductive filament, electrically connecting the first and second electrode, present.

Let $R_H$ and $R_L$ denote the high and low resistances, respectively. The Resistance Ratio (RR) is $RR=(R_H-R_L)/R_L$. Here $R_H$, $R_L$ and RR are determined by also the sensing current or voltage, as shown in FIG. 1. Generally, a large RR makes it easier to distinguish the two resistance states of the resistive sense memory unit.

Figure 2:
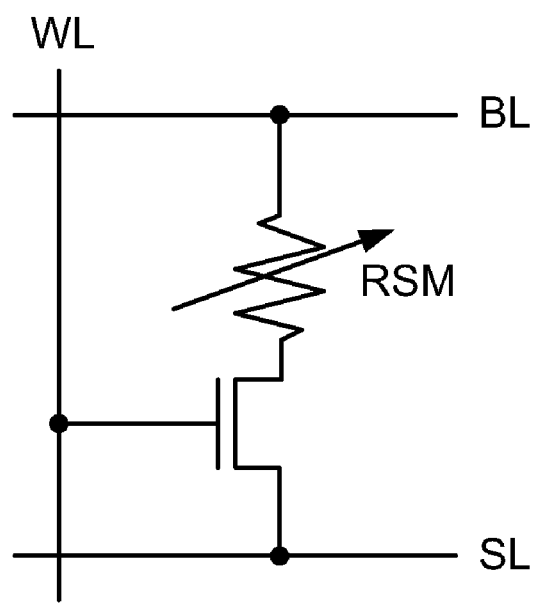
FIG. 2 is a schematic circuit diagram of a resistive sense memory unit.

FIG. 2 is a schematic diagram of a resistive sense memory unit RSM. The resistive sense memory unit is electrically connected in series to a transistor such as, for example, a NMOS transistor. The opposing side of the resistive sense memory unit RSM is electrically connected to a bit line BL. The transistor is electrically coupled to a source line SL and a word line WL. The MTJ is usually modeled as a variable resistor in circuit schematic, as shown in FIG. 2.

Some resistive sense memory units RSM use a sensing scheme that relies on a standard reference voltage to read the resistance value of the RSM. However, such a sense scheme requires that the maximum bit line voltage for the low resistance state be less than the minimum bit line voltage for the high resistance state for all of the RSMs in a memory array, which may not true when the variation of the RSM resistance is large.

Figure 3:
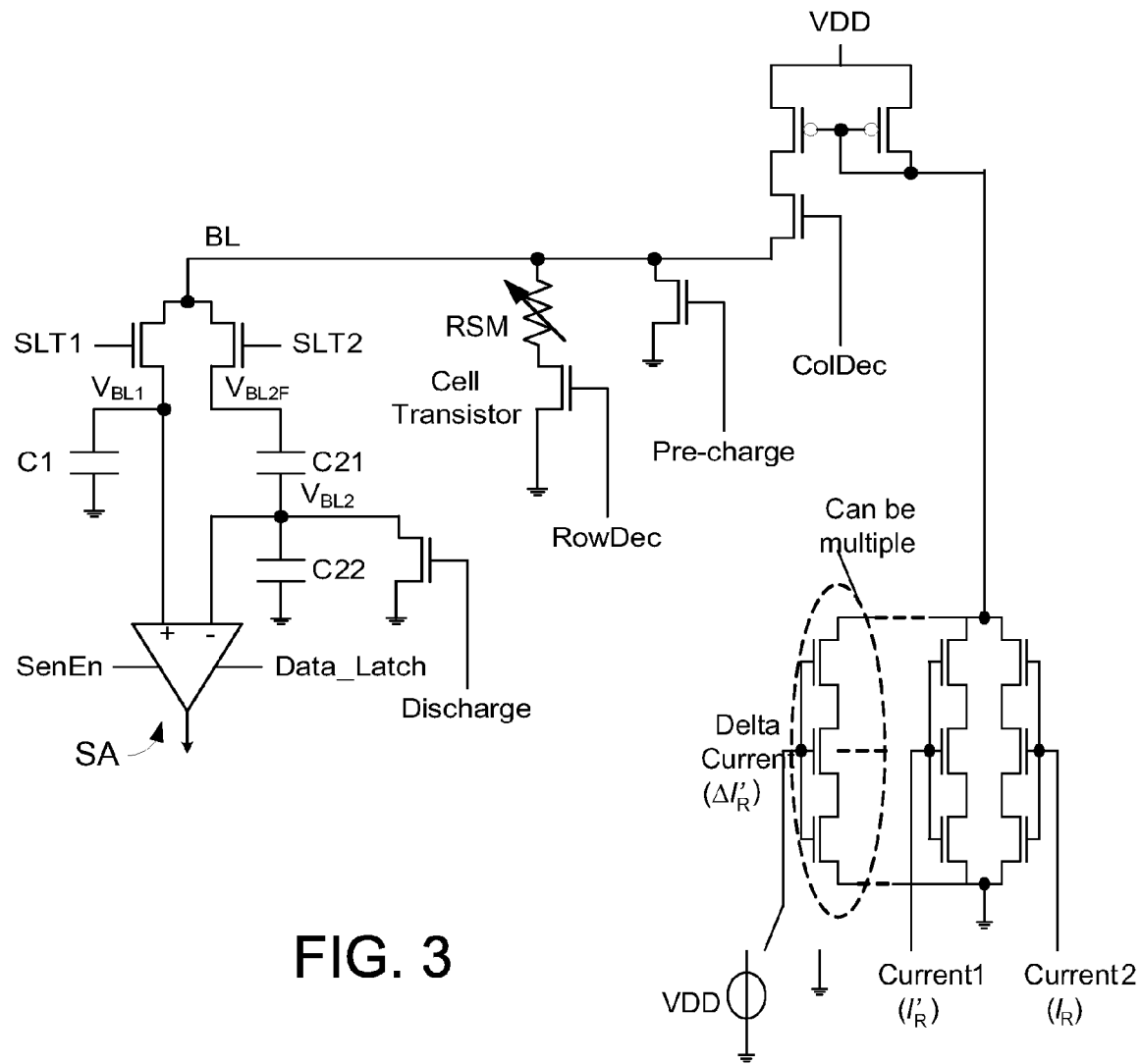
FIG. 3 is a schematic circuit diagram of an illustrative resistive sense memory apparatus.

FIG. 3 is a schematic circuit diagram of an illustrative resistive sense memory apparatus. The apparatus includes a resistive sense memory unit RSM having in MRAM or STRAM embodiments, a ferromagnetic free layer and a ferromagnetic reference layer separated by an oxide barrier layer, and in RRAM embodiments, a variable resistive layer. The resistive sense memory unit RSM is electrically between a bit line BL and a source line. The resistive sense memory unit RSM is configured to switch between a high resistance state and a low resistance state. A cell transistor allows read and write current to flow through the resistive sense memory unit RSM. A gate contact of the cell transistor is electrically coupled to a word line to allow selection of the particular cell transistor and associated resistive sense memory unit RSM.

Figure 5:
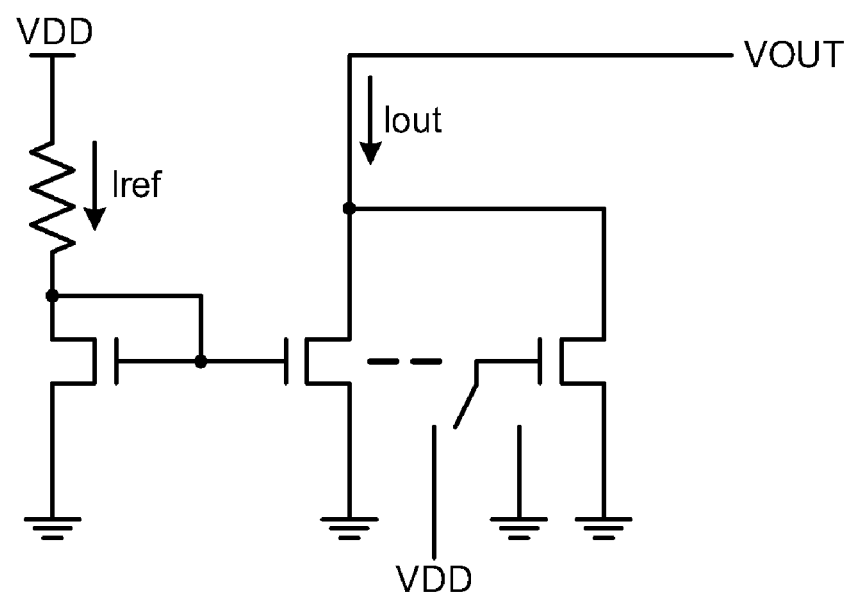
FIG. 5 is a schematic circuit diagram of an adjustable current mirror for FIG. 3.

An adjustable current driver (an illustrative schematic diagram is shown in FIG. 5) is electrically coupled to the bit line, the adjustable current driver configured to provide a first read current $I'_R$ and a second read current $I_R$ through the resistive sense memory unit RSM. A first voltage storage device C1 is electrically coupled to the bit line BL and configured to store a first bit line voltage $V_{BL1}$ formed by the first read current $I'_R$. A second voltage storage device C21 and C22 is electrically coupled to the bit line BL and configured to store a second bit line voltage $V_{BL2}$ formed by the second read current $I_R$. In many embodiments, the first voltage storage device C1, the second voltage storage device C21, and the third voltage storage device C22 are capacitors. Useful capacitors include, for example, n/p-type metal-oxide-silicon (NMOS/PMOS) capacitors, metal-insulator-metal (MIM) capacitors, and vertical natural capacitors, among others.

A differential sense amplifier SA is electrically coupled to the first voltage storage device C1 and is electrically coupled to an intermediate node electrically between the second voltage storage device C21 and the third voltage storage device C22. The differential sense amplifier is configured to compare the first bit line voltage $V_{BL1}$ with the second bit line voltage $V_{BL2}$. A first switch transistor STL1 is electrically connected to the bit line BL and the first voltage storage device C1. A second switch transistor STL2 is electrically connected to the bit line BL and the second voltage storage device C21 and the third voltage storage device C22. In many embodiments, the voltage storage devices are capacitors. In many embodiments, the second voltage storage device C21 and the third voltage storage device C22 are capacitors that each has substantially the same capacitance value as each other.

A first read current $I'_R$ is applied and incurs the corresponding BL voltage $V_{BL1}$, which is stored in C1. Depending on the resistance state of the RSM, $V_{BL1}$ can be either $V_{BL,L1}$ or $V_{BL,H1}$, which are the BL voltage for low resistance state of the RSM or high resistance state of the RSM, at $I_R$. A second read current $I_R$ which is larger than $I'_R$ is applied and incurs BL voltage $V_{BL2}$, which is stored in C21 and C22.

By comparing $V_{BL1}$ and $V_{BL2}$ with the differential sense amplifier SA, the data resistance state of the RSM can be readout. For example, if the first bit line read voltage $V_{BL1}$ is not substantially the same as or is larger than or significantly larger than the second bit line read voltage $V_{BL2}$ then the first resistance state is determined to be a high resistance state. Accordingly, if the first bit line read voltage $V_{BL1}$ is substantially the same as or less than the second bit line read voltage $V_{BL2}$ then the first resistance state is determined to be a low resistance state.

In many embodiments, if the stored first bit line read voltage $V_{BL1}$ is 10% greater than, or 25% greater than, or 50% greater than, or 100% greater than, the stored second bit line read voltage $V_{BL2}$ then the first resistance state is determined to be a high resistance state. Otherwise the resistance state is determined to be a low resistance state.

Figure 4:
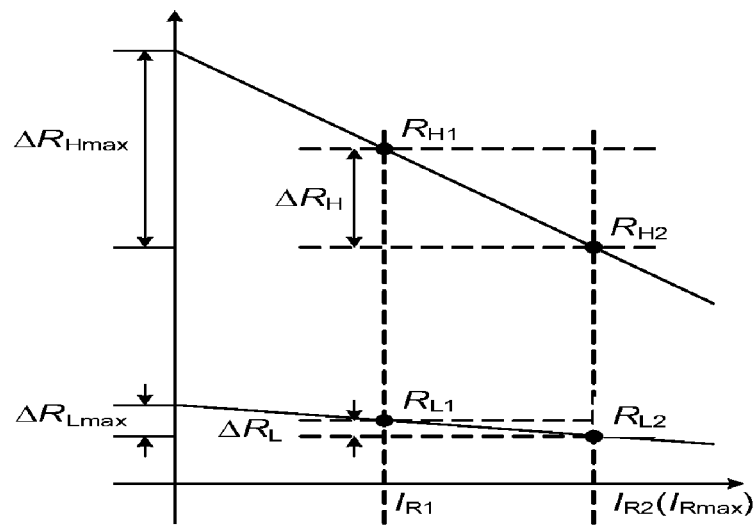
FIG. 4 is a graph of I-R (current-resistance) curves of the MTJ high resistance state and low resistance state.

FIG. 4 is a graph of I-R curves of one embodiment where the RSM is a MTJ and its high resistance state and low resistance state. The reference points $R_{L1}$ and $R_{L2}$ refer to the low resistance values (data state "0") of the RSM at the first read current $I'_R$ (i.e., $I_{R1}$) and the second read current $I_R$ (i.e., $I_{R2}$), respectively. The reference points $R_{H1}$ and $R_{H2}$ refer to the high resistance values (data state "1") of the MTJ at the first read current $I_{R1}$ and the second read current $I_{R2}$, respectively. The value $\Delta R_{LMAX}$ refers to the change in the MTJ low resistance value from zero to the maximum allowable read current $I_{RMAX}$. The value $\Delta R_{HMAX}$ refers to the change in the MTJ high resistance value from zero to the maximum allowable read current $I_{RMAX}$.

As illustrated in FIG. 4, the resistance of the magnetic tunnel junction data cell MTJ at the low resistance state is fairly insensitive to the change of read current/voltage. On the other hand, the resistance of the magnetic tunnel junction data cell MTJ at the high resistance state drops quickly when the read current/voltage increases. The change in the high state resistance value from the first read current $I_{R1}$ to the second read current $I_{R2}$ is shown as $\Delta R_H$. The change in the low state resistance value from the first read current $I_{R1}$ to the second read current $I_{R2}$ is shown as $\Delta R_L$. As illustrated, $\Delta R_L$ is significantly less than $\Delta R_H$. Knowing that $\Delta R_L$ is significantly less than $\Delta R_H$ provides a means for comparing the voltage or resistance across the magnetic tunnel junction data cell MTJ to determine if it is in the high or low resistance state.

In many embodiments, $I_{R2}$, is chosen to be $I_{RMAX}$. The first read current $I_{R1}$ is less than the second read current. In many embodiments, the first read current $I_{R1}$ is 40% to 60% of the second read current $I_{R2}$. In many embodiments, the first read current $I_{R1}$ is 40% to 50% of the second read current $I_{R2}$.

To read out the value of memory cell, the requirement of read currents $I'_R/I_R$ and the capacitors C21/C22 is:

$$I'_R \cdot (C21+C22)/C21 = I_R$$

The difference between $V_{BL,H1}$ and $V_{BL,H2}$ can be used to measure the robustness (sense margin) of this self-reference scheme as:

$$\Delta V_{BL,H} = V_{BL,H1} - V_{BL,H2} = I_{R1} \cdot (R_{H1} - R_{H2})$$

The larger $I_{R2}$ is, the smaller $R_{H2}$ will be, and the bigger $V_{BL,H}$ is. Therefore, the largest allowable read current $I_{Rmax}$ as $I_{R2}$. Then:

$$\Delta V_{BL,H} = I_{R1} \cdot \Delta R_{Hmax} \cdot \frac{(I_{Rmax} - I_{R1})}{I_{Rmax}}$$

When $I_{R1} = 0.5 I_{Rmax}$, the maximum $V_{BL,H}$ is reached at $$\frac{I_{R1} \cdot \Delta R_{Hmax}}{4}.$$

Correspondingly, the capacitances of C21 and C22 are equal.

The above calculation shows that a pre-characterized ratio of $I'_R/I_R$ and C21/C22 needs to be maintained. A large deviation away from the pre-determined ratio introduces a smaller sense margin, or even read operation failure (e.g., reading errors).

Another example is the voltage-version self-reference scheme. The basic concept is to use two different voltages $V'_R/V_R$ applied to memory cells. Different from the current-version, the sensed currents, which are usually transferred by a resistor, are compared to get the original value of memory cell. In general, the current $I'_R$ generated by the smaller voltage $V'_R$, needs to satisfy:

$$V'_R \cdot \alpha = V_R$$

Where $\alpha$ is the current ratio of a current mirror. The robustness of this self-sense scheme can be measured by the current difference between two voltage levels, which is transferred by $I'_R \cdot \alpha = I_R$ with a constant resistance:

$$\Delta V_{BL,H} = \left( \alpha \frac{V'_R}{R_{H1} + R_{TR}} - \frac{V_R}{R_{H2} + R_{TR}} \right) \cdot R_{con}$$

$$= \left( \frac{V_{Rmax}}{R_{max} - \Delta R_{Hmax} \cdot \frac{V'_R}{V_{Rmax}} + R_{TR}} - \frac{V_{Rmax}}{R_{max} - \Delta R_{Hmax} + R_{TR}} \right) \cdot R_{con}$$

The smaller $V'_R$ is, the larger the sense margin will be (without considering the variation of current ratio of current mirror). From the above analysis, a certain ratio of applied currents/voltages needs to be maintained to achieve the reliability of read operation. However, the capacitances and the current ratio of current mirror suffer from the process variations and vary die-to-die or even block-to-block.

Two different approaches to address the ratio mismatch issues in both current-version and voltage version of self-reference schemes, respectively are described herein. In a current version of self-reference scheme, the ratio of C21/C22 is determined after manufacture. Therefore, then the ratio of sense current $I'_R/I_R$ is adjusted by changing the $I'_R$ to compensate for any mismatch of C21/C22. One example of this approach is shown in FIG. 5.

The sense current is adjusted by controlling the mirrored current source. The gate voltage of the NMOS transistor is selectively connected to VDD and Ground, based on the ratio of C21 and C22. The switch of NMOS transistor gate can be implemented by either a CMOS circuit (for dynamic connection) or electrical fuse (for static connection).

If the ratio of C21 and C22 cannot be directly measured, then the current ratio of the current mirror can be dynamically adjusted to achieve the best combination. The combination can be stored in some nonvolatile memory or fixed by electrical fuse.

For the voltage version of self-reference scheme, the ratio of $V'_R/V_R$ can be adjusted by changing the operation voltage of the voltage regulator. Again, the $V'_R/V_R$ can be tested and pre-determined before shipping the product out.

The mirror ratio $\alpha$ of the current mirror can also be adjusted dynamically. The conceptual schematic of an adjustable current mirror is shown in FIG. 5. The first the second read current (ratio) can be changed by: 1) changing the reference current source value as illustrated in FIG. 3, where the (adjustable) reference current is mirrored by a current mirror with a fixed current mirror ratio to generate the corresponding read current; 2) a fixed reference current is mirrored by a current mirror with an adjustable current mirror ratio $\alpha$, as shown in FIG. 5). The switch of the NMOS transistor can be implemented by either CMOS circuit (for dynamic connection) or electrical fuse (for static connection). The ratio of a can be tested and pre-determined before shipping the product out.

Figure 6:
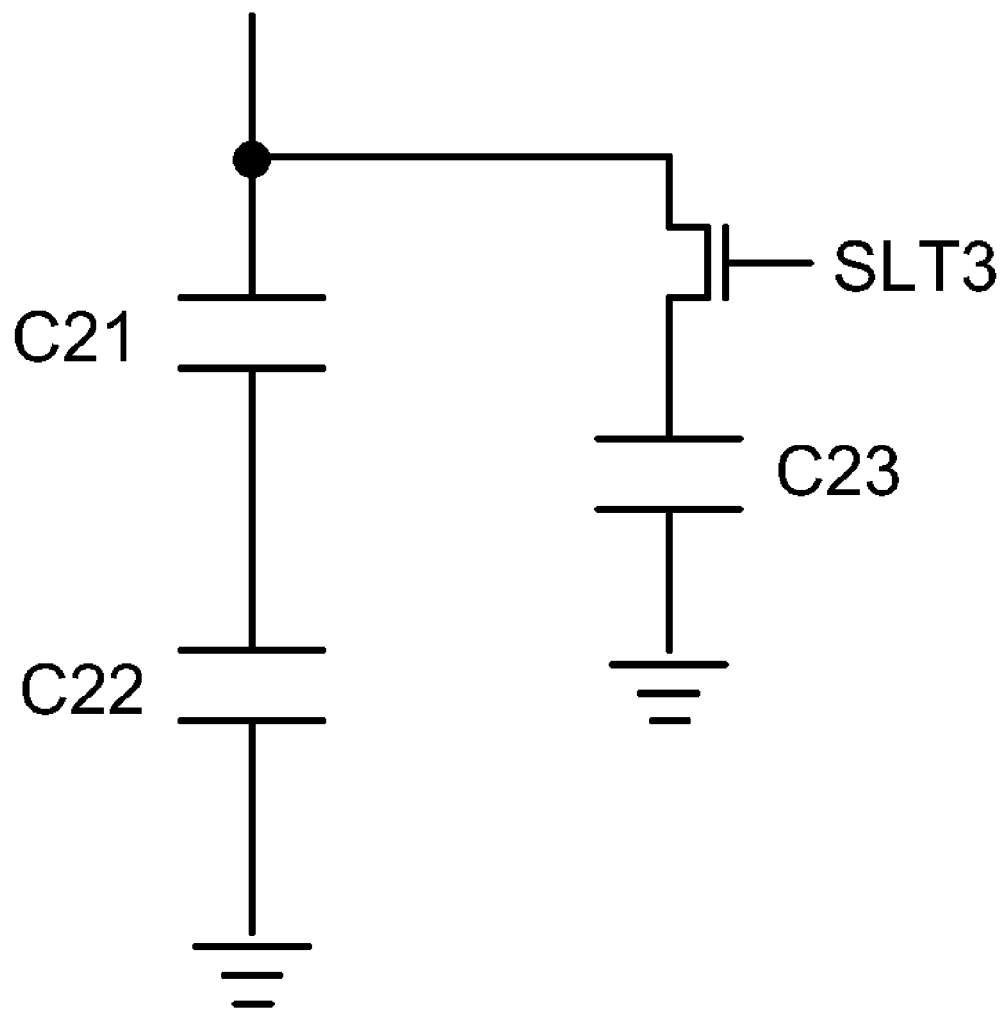
FIG. 6 is a schematic circuit diagram of an adjustable capacitance device for FIG. 3.

FIG. 6 is a schematic circuit diagram of an adjustable capacitance device for FIG. 3. If the ratio of C21 and C22 can be directly measured, then additional capacitance (e.g, C23) can be selected with any selection device such as a select transistor STL3, for example. The additional capacitance C23 can help to maintain the pre-characterized ratio of $I'_R/I_R$ and C21/C22.

The procedure of the above schemes can be summarized as two steps: 1) determining the desired design parameter by sensing reliability testing; and 2) adjusting the design parameters. The testing circuit can be either on-chip or off-chip, with necessary support circuit. Each memory cell can be set to a specified resistive data state and read our utilizing the above self-reference non-destructive read method. For each cell that does not read out with the specified resistive data state, the reading currents can be adjusted (by adjusting the current source or adjusting a mirror ratio of a current mirror) or the read voltage storing devices' capacitance can be adjusted, or the read voltages can be adjusted. These adjusted values can be stored so that when the specific memory cell is read out, it is read out utilizing the stored adjusted values.

Knowing what resistive data state was written to the resistive sense memory unit determines how the read current, read voltage or capacitance should be adjusted. For example, if a high resistance state was written to the resistive sense memory unit but the high resistance state is not read out, then the reference voltage is too high and the read voltage or read current is reduced until the high resistance state is read out. Similarly, the capacitance of $C_{21}$ can be reduced or the capacitance of $C_{22}$ is increased. Likewise, if a low resistance state was written to the resistive sense memory unit but the low resistance state is not read out, then the reference voltage is too low and the read voltage or read current is increased until the low resistance state is read out. Similarly, the capacitance of $C_{21}$ can be increased or the capacitance of $C_{22}$ is decreased.

Figure 7:
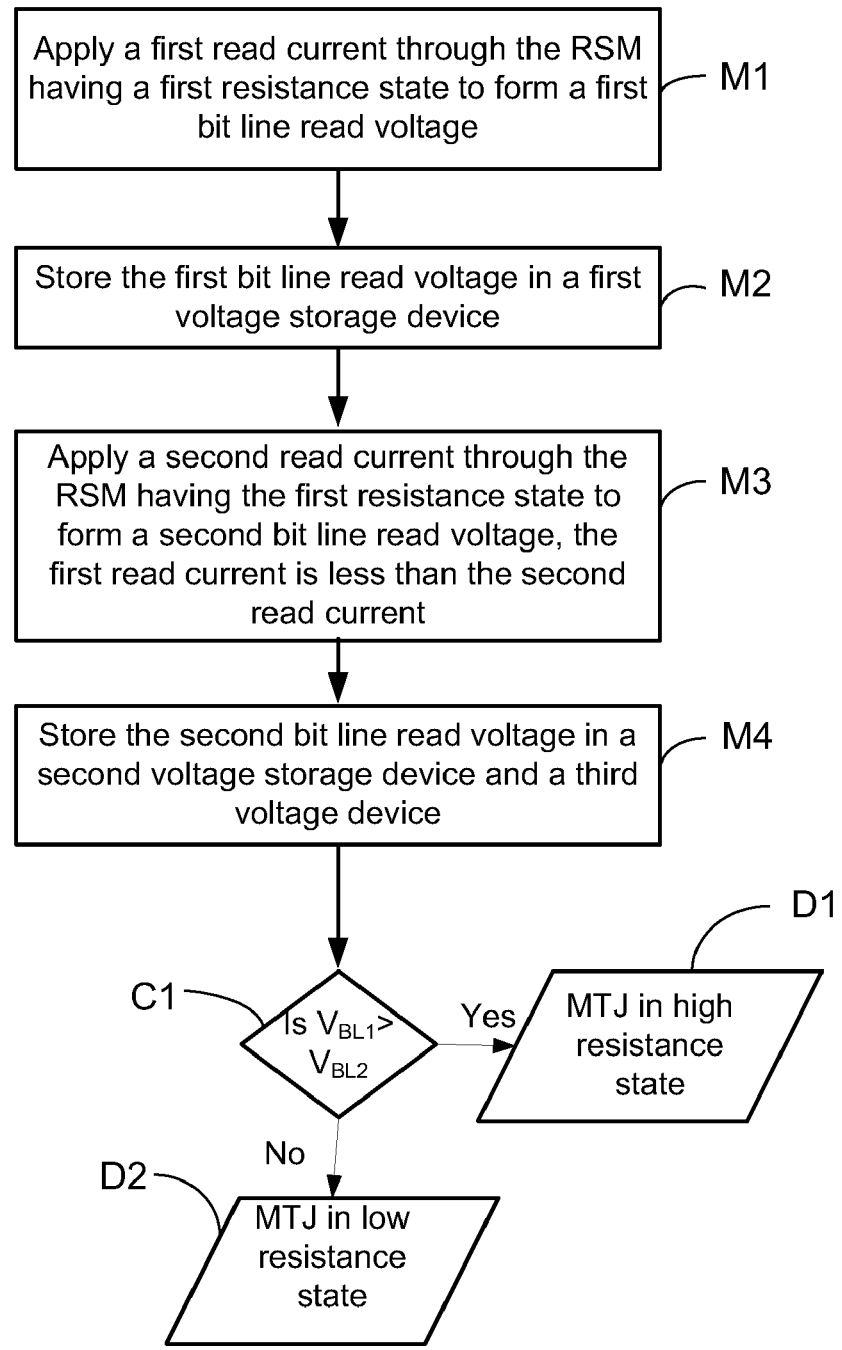
FIG. 7 is a flow diagram of an illustrative self-reference reading method.

FIG. 7 is a flow diagram of an illustrative self-reference reading method. The method includes applying a first read current through a resistive sense memory unit RSM and forming a first bit line read voltage, the resistive sense memory unit RSM having a first resistance state at block M1 and storing the first bit line read voltage in a first voltage storage device at block M2. A second read current is applied thorough the first resistance state resistive sense memory unit RSM to form a second bit line read voltage, where the first read current is less than the second read current at block M3 and storing the second bit line read voltage in a second voltage storage device and optional a third voltage storage device at block M4. Then comparing the first bit line read voltage with the second bit line read voltage to determine whether the first resistance state of the resistive sense memory unit RSM was a high resistance state or low resistance state.

The comparing block C1 compares the first bit line read voltage ($V_{BL1}$) with the second bit line read voltage ($V_{BL2}$). If the first bit line read voltage ($V_{BL1}$) is greater than the second bit line read voltage ($V_{BL2}$) then the first resistance state of the resistive sense memory unit RSM is a high resistance state at block D1. If the first bit line read voltage ($V_{BL1}$) is not greater than the second bit line read voltage ($V_{BL2}$) then the first resistance state of the resistive sense memory unit RSM is a low resistance state block D2.

The comparing step includes comparing the first bit line read voltage with the second bit line read voltage and if the first bit line read voltage is greater than or is significantly greater than the second bit line read voltage then the first resistance state is determined to be a high resistance state. Accordingly, if the first bit line read voltage is substantially the same as or less than the second bit line read voltage then the first resistance state is determined to be a low resistance state.

Figure 8:
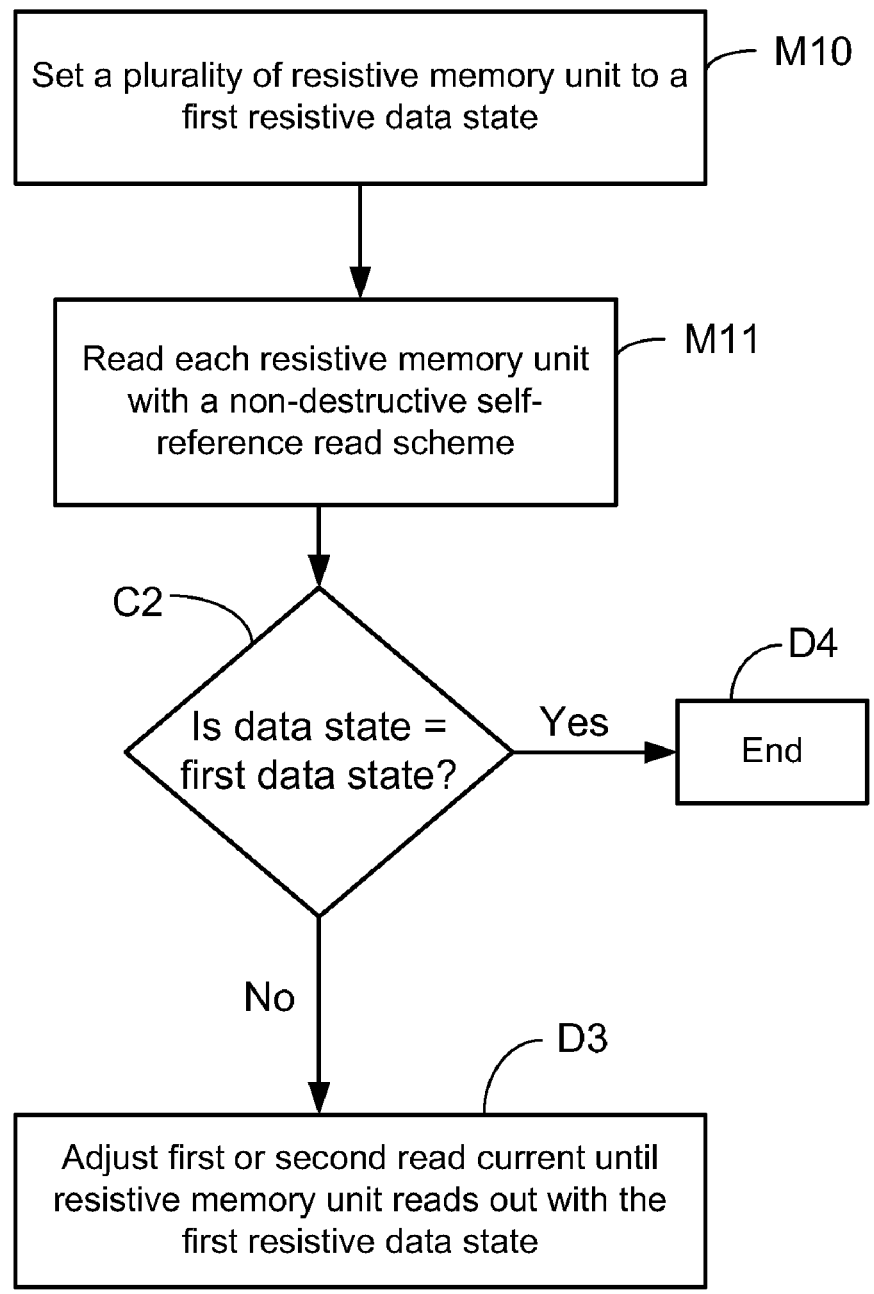
FIG. 8 is a flow diagram of an illustrative current adjusted self-reference reading method.

FIG. 8 is a flow diagram of an illustrative current adjusted self-reference reading method. The method includes setting a plurality of resistive memory units to a first resistive data state, at block M10. The resistive memory units form a memory array. In some embodiments the resistive memory units include MRAM such as, spin-transfer torque memory units, for example, or RRAM, as described above.

Then the method includes reading each resistive sense memory units resistive data state with a non-destructive self-reference read scheme, at block M11. In many embodiments, the non-destructive self-reference read scheme includes applying a first read current and a second read current through each resistive sense memory units and then comparing voltages formed by the first read current and a second read current to determine a resistive data state for each resistive sense memory units. The second read current can be greater than the first read current and in some embodiments, the second read current is a maximum read current for reading the resistive sense memory unit. In many embodiments, the first read current is 40% to 60% of the second read current. In these embodiments, the reading step does not alter or change the resistive data state of the resistive sense memory units.

At block C2, if the resistive data state read out is equal to the first data stats (that was set during the setting step above), then the method ends for that resistive sense memory cell, at block D4. If the resistive data state read out is not equal to the first data stats (that was set during the setting step above), then the method proceeds to the adjusting step, at block D3.

The adjusting step includes adjusting (by increasing or decreasing) a first read current or second read current for each resistive memory unit that did not read out with the first resistive data state until the resistive memory unit reads out with the first resistive data state, at block D3. For example, if a high resistance state was written to the resistive sense memory unit but the high resistance state is not read out, then the reference voltage is too high and the read current is reduced until the high resistance state is read out. Likewise, if a low resistance state was written to the resistive sense memory unit but the low resistance state is not read out, then the reference voltage is too low and the read current is increased until the low resistance state is read out.

The adjusted first or second read current can be stored so that the adjusted first or second read current is utilized each time when reading the particular resistive memory cell in the memory array. The currents can be adjusted with an adjusted current source or current mirror, and the like.

Figure 9:
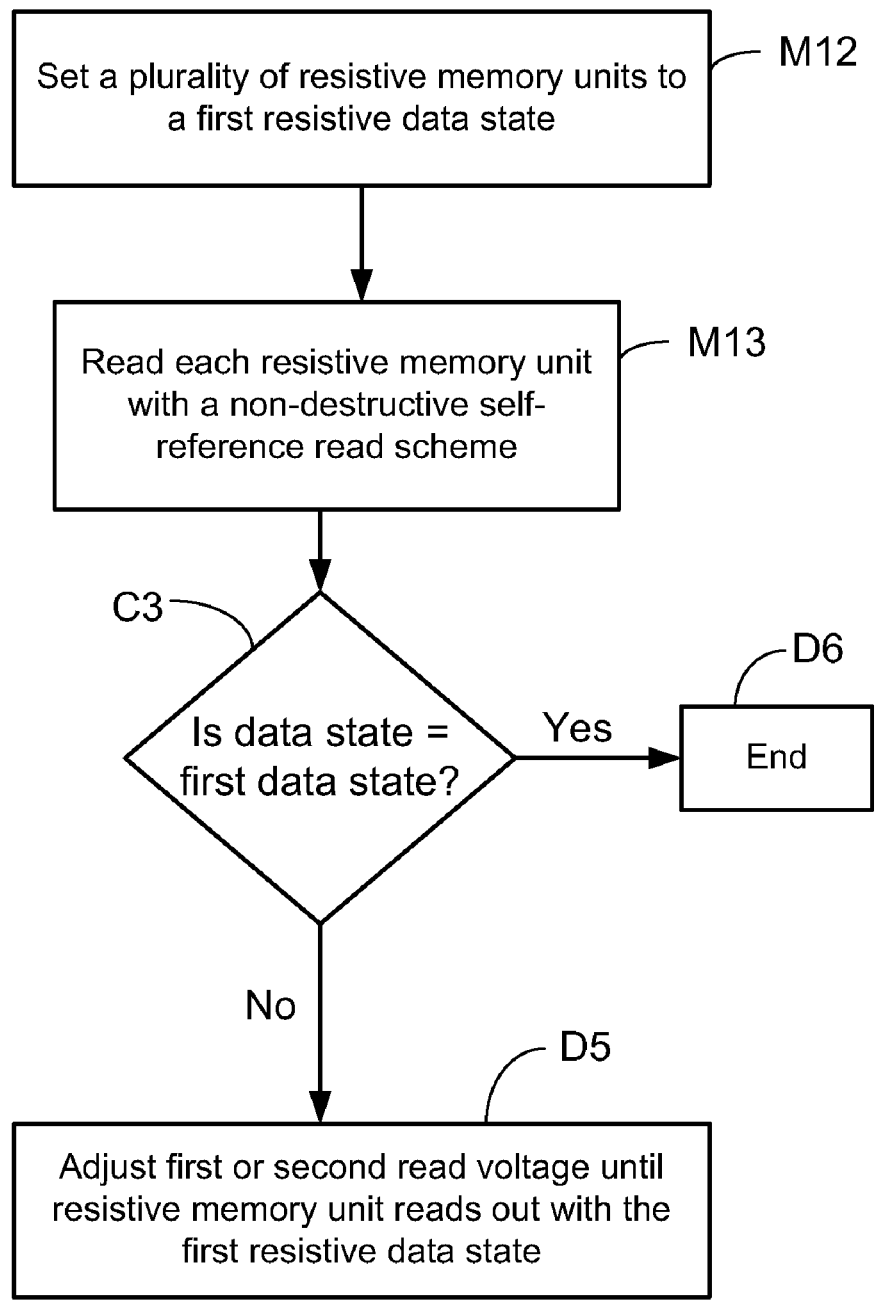
FIG. 9 is a flow diagram of an illustrative voltage adjusted self-reference reading method.

FIG. 9 is a flow diagram of an illustrative voltage adjusted self-reference reading method. The method includes setting a plurality of resistive memory units to a first resistive data state, at block M12. The resistive memory units forming a memory array. In some embodiments the resistive memory units include spin-transfer torque memory units, as described above.

Then the method includes reading each resistive memory unit resistive data state with a non-destructive self-reference read scheme, at block M13. In many embodiments, the non-destructive self-reference read scheme includes applying a first read voltage and a second read voltage across resistive memory unit and then comparing first read voltage with the second read voltage to determine a resistive data state for each resistive memory unit.

At block C3, if the resistive data state read out is equal to the first data stats (that was set during the setting step above), then the method ends for resistive memory unit, at block D6. If the resistive data state read out is not equal to the first data stats (that was set during the setting step above), then the method proceeds to the adjusting step, at block D5.

The adjusting step includes adjusting (by increasing or decreasing) the first or second read voltage for each magnetic tunnel junction data cell that did not read out with the first resistive data state until the resistive memory unit reads out with the first resistive data state, at block D5. For example, if a high resistance state was written to the resistive sense memory unit but the high resistance state is not read out, then the reference voltage is too high and the read voltage is reduced until the high resistance state is read out. Likewise, if a low resistance state was written to the resistive sense memory unit but the low resistance state is not read out, then the reference voltage is too low and the read voltage is increased until the low resistance state is read out.

The adjusted first or second read voltage can be stored so that the adjusted first or second read voltage is utilized each time when reading the particular resistive memory cell in the memory array. The voltages can be adjusted with an adjusted voltage regulator, and the like.

Figure 10:
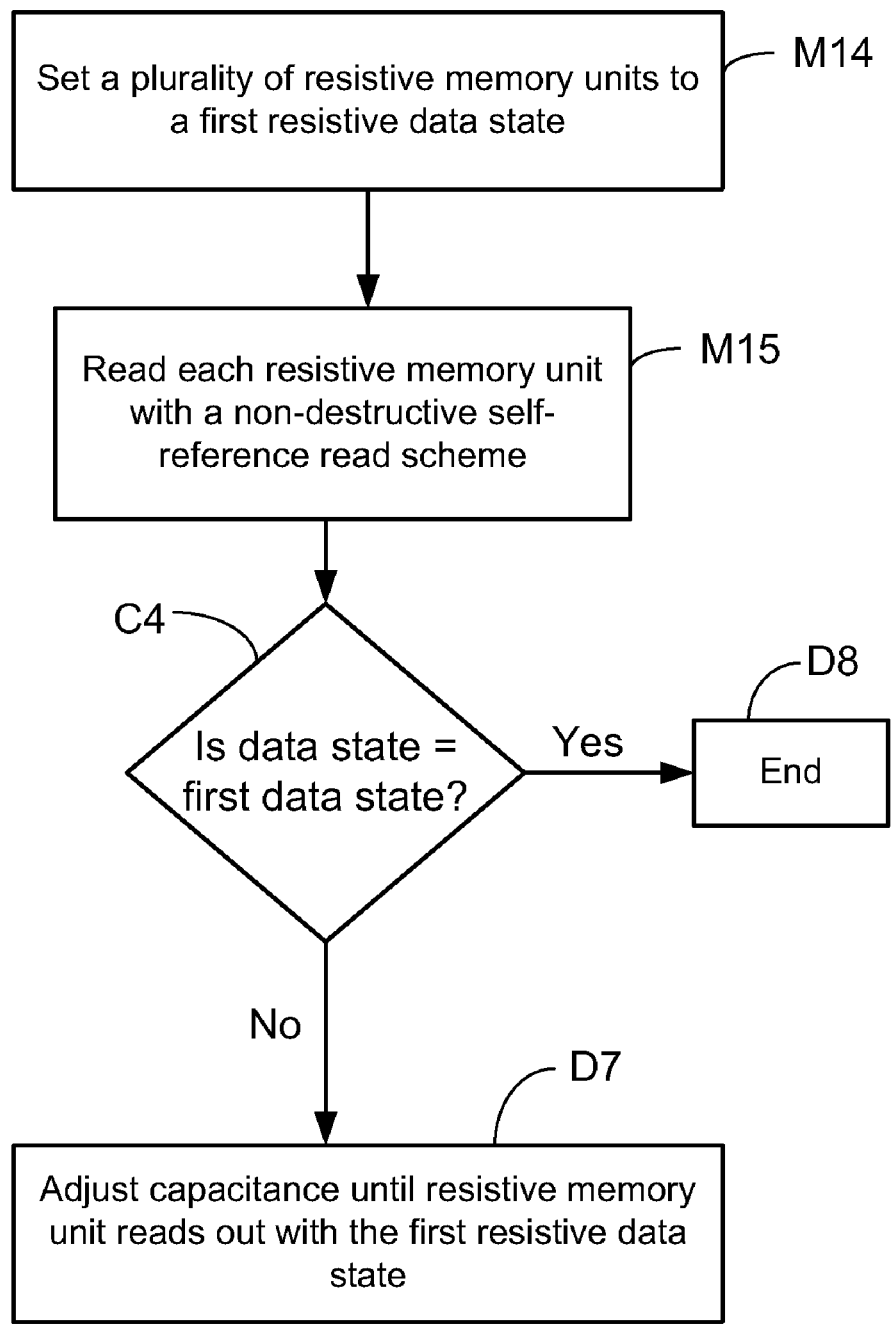
FIG. 10 is a flow diagram of an illustrative capacitance adjusted self-reference reading method.

FIG. 10 is a flow diagram of an illustrative capacitance adjusted self-reference reading method. The method includes setting a plurality of resistive memory units to a first resistive data state, at block M14. The magnetic tunnel junction data cells forming a memory array. In some embodiments the resistive memory units include spin-transfer torque or RRAM memory units, as described above.

Then the method includes reading each resistive memory unit resistive data state with a non-destructive self-reference read scheme, at block M15. In many embodiments, the non-destructive self-reference read scheme includes applying first read current and a second read current through each resistive memory unit and then storing a first read voltage formed by the first read current in a first voltage storage device and storing a second read voltage formed by the second read current in a second voltage storage device and then comparing first read voltage with the second read voltage to determine a resistive data state for each resistive memory unit.

At block C4, if the resistive data state read out is equal to the first data stats (that was set during the setting step above), then the method ends for resistive memory unit, at block D8. If the resistive data state read out is not equal to the first data stats (that was set during the setting step above), then the method proceeds to the adjusting step, at block D7.

The adjusting step includes adjusting (increasing or decreasing) capacitance of the first or second voltage storage device for each resistive memory unit that did not read out with the first resistive data state until the resistive memory unit reads out with the first resistive data state, at block D7. For example, if a high resistance state was written to the resistive sense memory unit but the high resistance state is not read out, then the reference voltage is too high and the capacitance of $C_{21}$ can be reduced or the capacitance of $C_{22}$ is increased. Likewise, if a low resistance state was written to the resistive sense memory unit but the low resistance state is not read out, then the reference voltage is too low and the capacitance of $C_{21}$ can be increased or the capacitance of $C_{22}$ is decreased.

The adjusted capacitance can be stored so that the adjusted capacitance is utilized each time when reading the particular resistive memory cell in the memory array. The capacitance can be adjusted as described above.

Thus, embodiments of the RESISTIVE SENSE MEMORY CALIBRATION FOR SELF-REFERENCE READ METHOD are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A method, comprising:
setting a plurality of resistive memory units to a first resistive data state, the resistive memory units forming a memory array;
reading a sensed resistive data state for each resistive memory unit by applying a first read current and a second read current through each resistive memory unit to determine the sensed resistive data state for each resistive memory unit; and
adjusting the first read current or the second read current for each resistive memory unit where the sensed resistive data state was not the same as the first resistive data state until the sensed resistive data state is the same as the first resistive data state.

2. A method according to claim 1 wherein the resistive memory units comprise spin-transfer torque memory units.

3. A method according to claim 1 further comprising storing an adjusted first read current value or an adjusted second read current value for each resistive memory unit that utilized the adjusting step.

4. A method according to claim 1 wherein the first read current is 40% to 60% of the second read current.

5. A method according to claim 1 wherein the adjusting step comprises increasing or decreasing the first read current or second read current with an adjustable current mirror.

6. A method according to claim 5 wherein the adjusting step comprises adjusting a mirror ratio of the adjustable current mirror to modify the first read current or the second read current.

7. A method according to claim 6 further comprising storing the adjusted mirror ratio of the adjustable current mirror for each resistive memory unit that utilized the adjusting step.

8. A method according to claim 1 wherein the reading step does not change a data state of at least selected resistive memory units.

9. A method, comprising:
setting a plurality of resistive sense memory units to a first resistive data state, the resistive sense memory units forming a memory array;
reading a sensed resistive data state for each resistive sense memory unit by applying a first read current and a second read current through each resistive sense memory unit and then storing a first read voltage formed by the first read current in a first voltage storage device and storing a second read voltage formed by the second read current in a second voltage storage device to determine the sensed resistive data state for each resistive sense memory unit; and
adjusting capacitance of the first or second voltage storage device for each resistive sense memory unit where the sensed resistive data state was not the same as the first resistive data state until the sensed resistive data state is the same as the first resistive data state.

10. A method according to claim 9 wherein the first voltage storage device comprises a first capacitor and the second voltage storage device comprises a second capacitor and a third capacitor, the second capacitor and the third capacitor are electrically connected in series.

11. A method according to claim 10 wherein the reading step comprises comparing the first read voltage with the second read voltage and the stored second voltage is sensed at an intermediate node electrically between the second capacitor and the third capacitor.

12. A method according to claim 9 wherein the resistive sense memory units comprise spin-transfer torque memory units.

13. A method according to claim 9 further comprising storing an adjusted capacitance of the first or second voltage storage device for each resistive sense memory unit that utilized the adjusting step.

14. An apparatus, comprising:
an array of resistive memory units;
a self-reference read circuit comprising an electrical adjustment circuit for adjusting an electrical property of the self-reference read circuit so that sensed resistive data for each resistive memory unit can be adjusted until the sensed resistive data state is the same as a predetermined first resistive data state for each resistive memory unit.

15. An apparatus according to claim 14, wherein the electrical adjustment circuit comprises an adjustable read current source, an adjustable read voltage source, or a voltage storage device having an adjustable capacitance.

16. An apparatus according to claim 14, wherein the resistive memory units comprise spin-transfer torque memory units.

17. An apparatus according to claim 15, wherein the voltage storage device having an adjustable capacitance comprises a first voltage storage device and a second voltage storage device and a third voltage storage device, the second voltage storage device and the third voltage storage device are electrically connected in series.

18. An apparatus according to claim 17, wherein the second voltage storage device includes at least a fourth voltage storage device selectively electrically connected with the second voltage storage device and the third voltage storage device.

19. An apparatus according to claim 15, wherein the adjustable read current source comprises an adjustable current mirror.

20. An apparatus according to claim 15, further comprising a differential sense amplifier electrically coupled to the self-reference read circuit.

* * * * *